(12) United States Patent
Maslen

(10) Patent No.: US 7,977,950 B2
(45) Date of Patent: Jul. 12, 2011

(54) TIME-DOMAIN REFLECTOMETER

(75) Inventor: Stephen Maslen, Somerset (GB)

(73) Assignee: Radiodetection Ltd., Bristol (GB)

( * ) Notice: Subject to any disclaimer, the term of this patent is extended or adjusted under 35 U.S.C. 154(b) by 286 days.

(21) Appl. No.: 12/411,135

(22) Filed: Mar. 25, 2009

(65) Prior Publication Data

US 2010/0073014 A1 Mar. 25, 2010

(30) Foreign Application Priority Data

Mar. 25, 2008 (GB) .................................. 0805407.4

(51) Int. Cl.
*G01R 31/11* (2006.01)
(52) U.S. Cl. ........................................ 324/534; 324/533
(58) Field of Classification Search .................. 324/533, 324/534
See application file for complete search history.

(56) References Cited

U.S. PATENT DOCUMENTS 5,600,248 A * 2/1997 Westrom et al. .............. 324/522
7,250,771 B1 * 7/2007 Lo et al. ........................ 324/533

FOREIGN PATENT DOCUMENTS

| GB | 2344239 A | 5/2000 |
| JP | 3072724 A | 3/1991 |
| WO | 2005104507 A1 | 11/2005 |

* cited by examiner

*Primary Examiner* — Vincent Q Nguyen
(74) *Attorney, Agent, or Firm* — Baker & Hostetler LLP

(57) ABSTRACT

The present invention provides a time domain reflectometer for testing an electrical cable. The time domain reflectometer includes a test signal generator, at least one line feed resistor, connected between the test signal generator and a pair of terminals, for connection to the ends of the electrical cable under test, and a signal processor, connected to the terminals, to receive a line signal including a reflection of a test signal transmitted into the cable under test. The signal processor is programmed to filter the line signal to enhance a portion of the signal indicative of any fault on the cable by balancing the signal according to the electrical characteristics of a normal cable of the same type as the cable under test by applying a filter function, and acquiring at least one estimate of the input admittance of the transmission line from known or estimated electrical characteristics of the cable under test.

12 Claims, 8 Drawing Sheets ously incorporated by reference in its entirety for all purposes.

TIME-DOMAIN REFLECTOMETER

CROSS-REFERENCE TO RELATED APPLICATIONS

This application claims priority to GB 0805407.4, filed on Mar. 25, 2008 and entitled "Time-Domain Reflectometer," the disclosure of which is incorporated herein by reference in its entirety.

FIELD OF THE INVENTION

This invention relates to a time-domain reflectometer and to a method of time-domain reflectometry, for testing electrical cables that may be faulty or have faulty terminations.

BACKGROUND OF THE INVENTION

Whenever a signal travelling along a transmission line encounters some change, i.e., discontinuity, in the line characteristic, a portion of the signal is reflected back towards the sending end of the line. The nature of the reflection signal is determined by the discontinuity characteristic, which might be anywhere between a short circuit and an open circuit.

Time domain reflectometers provide a means to determine the characteristics of faulty and normal electrical transmission lines, by sending an excitation signal, receiving a reflected response and analysing the response.

FIG. 1 (Prior Art) shows schematically the external appearance of a portable time domain reflectometer, TDR. Other forms are possible, for instance a fixed installation wherein the TDR is automatically controlled and does not require any user keypad or visual display.

FIG. 2 (Prior Art) shows the typical blocks that make up a TDR. These are:

Power Supply—which provides the necessary power to the various circuits;

Processor/Memory—which, as in many examples of modern instrumentation, provides overall operational control, processing of user actions, control of information provided to the user, management for the generation of test signals, management for the acquisition of measured signals, mathematical analysis of measurements and the application of signal processing algorithms.

In this context, the term "user" might also mean a separate piece of linked system control equipment as well as a human operator;

User Interface(s)—in a portable TDR these would typically be a keypad for entering commands/data and a screen for the display of measured signal responses, derived measurements and system information. In a fixed installation, the user interface might consist of a serial communication port such as a RS232 or USB port;

Test Signal Generator—provides a test signal for application to the transmission line (cable) under test. In practice it might be in the form of a voltage source or a current source. It might also be presented in either a single-ended (unbalanced) or balanced form.

Line Feed Resistor(s)—this or these provide the correct matching impedance for the line being tested. As previously mentioned, when a signal travelling along a transmission line encounters a change in characteristic, a reflection occurs. This is also true for a reflected wave returning to the TDR instrument. The instrument should therefore present an impedance characteristic sensibly close to the impedance characteristic of the line under test, if it is to avoid causing further unwanted signal reflections. The line feed resistor(s) is or are therefore provided to give the correct matching characteristic for the line under test. Multiple selections may be provided to cater for various line types.

In practical realisations, the test signal generator may consist of a voltage generator which is then arranged in series with the line feed resistor(s) or a current generator arranged in parallel with the line feed resistor(s). These are equivalent as per the well known Thevenin and Norton equivalent forms. Also the signals might be provided, and the responses measured, as either a single-ended or a balanced form which are well known in measurement systems. The later analysis is presented in the single-ended (unbalanced) form although this is easily extended to the balanced form, as is well known.

Additionally, some form of dc isolation might be provided between the TDR instrument circuitry and the connectors providing the access to the line (cable) under test. Typically this is done by the use of capacitors whose value is chosen to have minimal effect on the signals generated to and received from the line (cable) under test. If these capacitors do have a significant effect, it can be compensated for by the use of traditional analogue or digital filter techniques.

Signal Measurements—This block provides the ability to capture the electrical signals appearing on the TDR line (cable) under test, access point. It can therefore acquire signals with or without the cable actually connected. Typically an input amplifier of suitable impedance when considered in conjunction with the line feed resistor(s) will pass the signal to an analogue to digital converter (ADC) which is used to capture signal values on a point by point basis in time, which are then passed via the processor to a memory store for later evaluation.

In a practical TDR, the effect on the measured signal due to any dc isolation may again be compensated for by use of traditional analogue or digital filter techniques. Also, the input amplifier/ADC circuit may be presented in either single-ended (unbalanced) or balanced configurations.

Access Point—provides the terminal connections such that the cable under test can be connected to the instrument's test and measurement circuitry.

Traditional TDRs use a substantially rectangular pulse, or pulses that are smoother in nature such as a half-sine shape or a raised cosine shape. Other TDRs use a step waveform, which does not return to zero over the duration of the measurement.

One characteristic of an electrical transmission line is the rise/fall charge transients that can be seen when signals are applied to its input. This effect can hinder the observation and analysis of weak reflection signals in TDR responses. It is thus of fundamental interest to substantially remove this unwanted characteristic.

A variety of hardware and software techniques exist to reduce the unwanted effect. These techniques may be referred to as compensation, correction, balance or signal processing, amongst others.

One technique is to make measurements (baseline reference results) on a known good line of the same type being tested and then to subtract this reference signal from the subsequent line test response. The resulting response then primarily consists of only the desired reflection response. This method has the disadvantage of requiring access to known good lines, which may not be convenient or even possible.

Another technique provides an adjustable hardware balance network, which attempts to provide an approximation of the unwanted effect, which can be subtracted from the overall response. In practice, the unwanted characteristic, which is described by a combination of Bessel functions and exponential decays, is not easily characterised by simple hardware circuits and the balance effectiveness is of only limited value. In any case it is desirable to replace hardware solutions with software solutions, where possible. This principle is illustrated in FIG. 3.

Other techniques based on signal processing software alone may be applied.

SUMMARY OF THE INVENTION

Embodiments of the present invention advantageously improves time domain reflectometry with regard to its readability and its range of measured responses.

Accordingly, embodiments of the present invention provide a time domain reflectometer for testing an electrical cable, comprising a test signal generator; at least one line feed resistor connected between the test signal generator and a pair of terminals for connection to the ends of the electrical cable under test; and a signal processor connected to the terminals to receive a line signal including a reflection of a test signal transmitted into the cable under test; the signal processor being programmed to filter the line signal to enhance a portion of the signal indicative of any fault on the cable by balancing the signal according to the electrical characteristics of a normal cable of the same type as the cable under test, by applying a filter function: $1+Rf.Y(s)$ to the reflected signal, where $Rf$ is the resistance of the feed resistor, and $Y(s)$ is an estimate of the input admittance of the transmission line, s being the Laplace variable, and acquiring at least one estimate of $Y(s)$ from known or estimated electrical characteristics of the cable under test selected from the variables: C, the distributed line capacitance per unit length, L, the distributed line inductance per unit length, R, the distributed line resistance per unit length and G, the distributed line conductance per unit length or functions of these variables, in the equation for input admittance in the Laplace domain: $Y(s)=\sqrt{((sC+G)/(sL+R))}$.

Embodiments of the present invention also provide a method of time domain reflectometry comprising transmitting a test signal through at least one line feed resistor to the ends of an electrical cable under test, receiving a line signal from the cable at those ends, and filtering the line signal to enhance a portion of the signal indicative of any fault on the cable by balancing the signal according to the electrical characteristics of a normal cable of the same type as the cable under test, by applying a filter function, to generate and output a filtered signal.

Time domain reflectometers embodying the present invention can implement software-based filtration substantially removing the input transient effect from TDR responses. This requires minimal prior knowledge of the cable electrical characteristics. It is capable of performing sufficiently well that it allows very small reflections to be separated from input transients. Further, there is no requirement for special loading conditions, i.e. for hardware-based balancing at the terminals of the cable under test.

The techniques of the present invention can of course be applied not only to faulty cables but also to normal or non-faulty cables.

BRIEF DESCRIPTION OF THE DRAWINGS

In order that the invention may be better understood, a preferred embodiment will now be described, by way of example only, with reference to the accompanying drawings, in which.

DETAILED DESCRIPTION

Glossary of Terms

Figure 1:
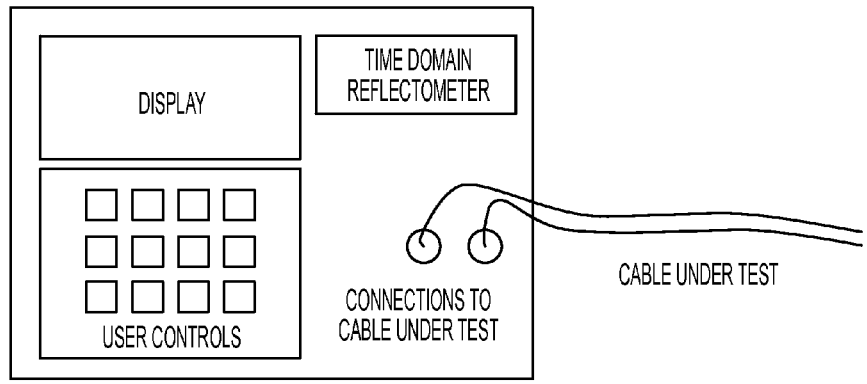
FIGS. 1 to 3 are schematic diagrams of known time domain reflectometers.

| Standard Engineering Terms | |
|---|---|
| TDR | Time Domain Reflectometer |
| RS232 | A serial data exchange standard |
| USB | Universal Serial Bus, a serial data exchange standard |
| ADC | Analogue to Digital Converter |

| Standard Mathematical Terms | |
|---|---|
| s | The Laplace variable, familiar to circuit and signals specialists |
| $I_0$ and $I_1$ | The zero$^{th}$ and first order modified Bessel function as defined in standard mathematical texts |
| $\delta(t)$ | the dirac delta function, familiar to signals specialists |
| f | frequency in Hertz |
| w | frequency in radians per second = $2\pi f$ |
| $L^{-1}$ | the inverse Laplace Transform operation |
| $Z^{-1}$ | delay of 1 sample, in a sampled data system |

| Standard Transmission Line Terms | |
|---|---|
| R | is the distributed line resistance per unit length |
| L | is the distributed line inductance per unit length |

-continued

Standard Transmission Line Terms

| | |
|---|---|
| G | is the distributed line conductance per unit length |
| C | is the distributed line capacitance per unit length |
| Y(s) | is the line input admittance in Laplace form = $\sqrt{((sC + G)/(sL + R))}$ |
| Z(s) | is the line input impedance in Laplace form = $1/Y(s)$ |
| Y(t) | is the time domain convolution admittance = $L^{-1} Y(s)$ |
| $Z_0$ | is the characteristic line impedance = $\sqrt{(L/C)}$ |
| $Y_0$ | $=1/Z_0$ |

Terms Defined Herein

| | |
|---|---|
| Rf | is the Feed Resistor and its Resistance |
| VS(s) | is a voltage signal for application to the feed resistor, represented in the Laplace domain |
| VS(t) | is a voltage signal equivalent to VS(s), but represented in the time domain |
| VL(s) | is a voltage signal appearing on the line, represented in the Laplace domain |
| VL(t) | is a voltage signal appearing on the line, equivalent to VL(s) but represented in the time domain |
| VL(n) | is a voltage signal appearing on the line, equivalent to VL(s) but represented as a series of time samples |
| VP(s) | is a voltage signal resulting from some filtering function applied to VL(s), represented in the Laplace domain |
| VP(t) | is a voltage signal equivalent to VP(s), but represented in the time domain, |
| VP(n) | is a voltage signal equivalent to VP(s) but represented as a series of time samples, |
| v | $=((G/C) - (R/L))/2$ |
| u | $=((G/C) + (R/L))/2$ |
| Vpu | voltage at top of test pulse leading edge, with no cable under test connected |
| Vpl | voltage at top of test pulse leading edge with cable under test connected |
| $b_k$ | the kth coefficient of a traversal digital filter, where k is an integer 0, 1, 2, 3 ... |

The preferred embodiments of the invention make use of transmission line equations, filters derived from them in time or frequency domains and the automated tuning of the filters to produce an optimal reduction in the input transient effect.

The well known transmission line equations provide the transmission line input admittance Y(s) as:

$$Y(s)=\sqrt{((sC+G)/(sL+R))} \quad (1)$$

It is the characteristics of equation (1) that determine the response at the input of a transmission line, including the unwanted input transient effects.

Figure 2:
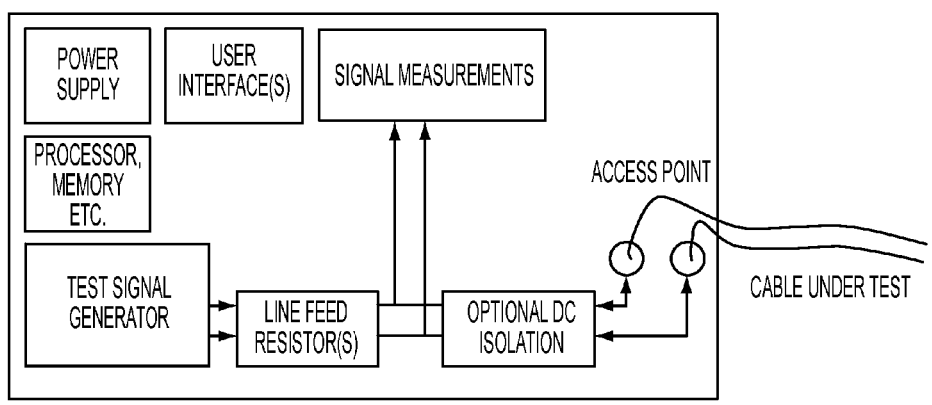
Figure 3:
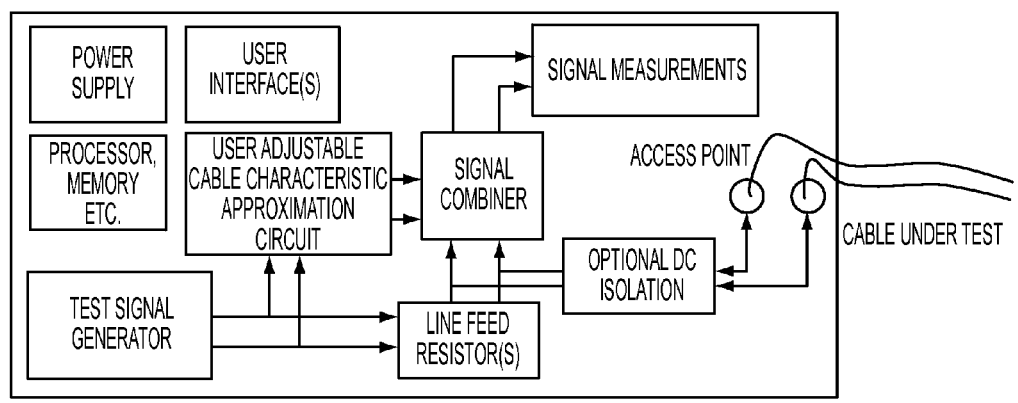
Figure 4:
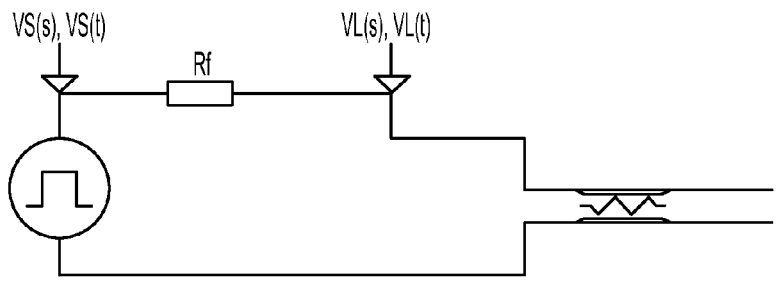
FIG. 4 is a schematic circuit diagram of basic signals and elements in a time domain reflectometer.

FIG. 4 shows the essential elements of a TDR from the block diagram of FIG. 2, in a form familiar for circuit/signal analysis. For simplicity, the principles are developed for the single-ended (unbalanced) case, but this can be routinely extended to the balanced case if desired.

FIG. 4 shows a simplified representation of the signals applied in a time-domain reflectometer, whereby a test signal VS(s) is applied via a feed resistor Rf to the transmission line under test.

Using standard notation, the signal at the input to the transmission line VL(s) is described as:

$$VL(s)=VS(s)/(1+Rf.Y(s)) \quad (2)$$

Figure 5:
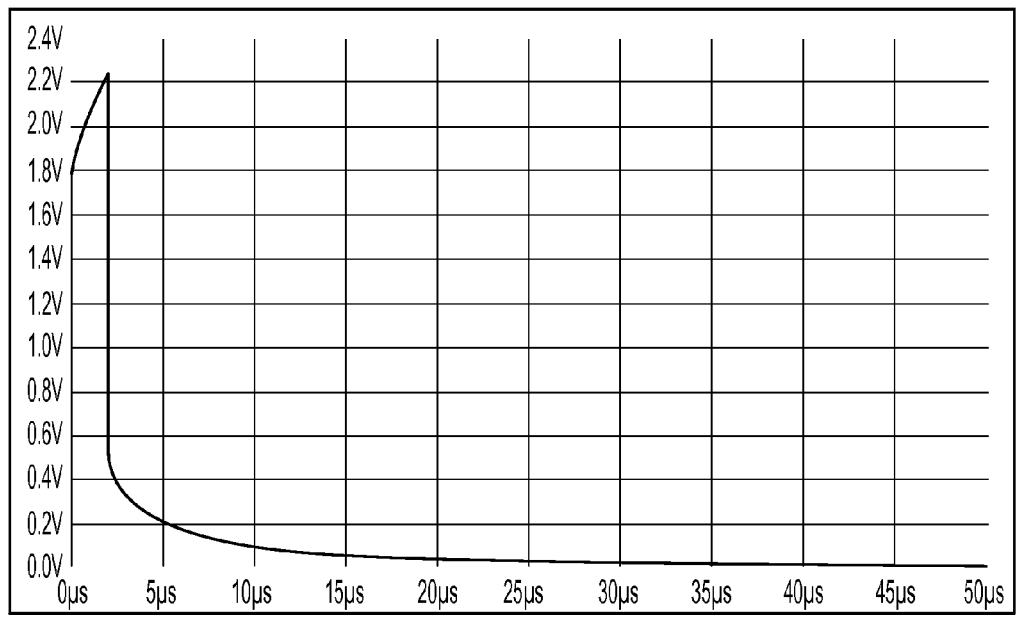
FIG. 5 is a graph showing a time domain reflectometer test pulse, plotted as voltage in volts against time in microseconds, showing unwanted input transient signals.

For the purposes of this analysis, any reflected signals, that might add on to the applied signal, are ignored. Although the principles that follow are valid for any test signal, for the purposes of clarity, the examples are for the case where the test signal is a single pulse. In practice, the line signal VL(s) when considered in the time domain VL(t) includes some degree of unwanted transient response, as illustrated in FIG. 5.

Figure 6:
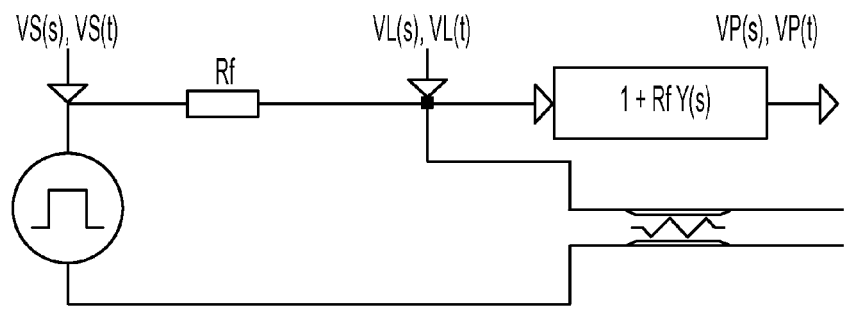
FIG. 6 is a schematic diagram of a time domain reflectometer embodying the present invention.

In accordance with the invention, a filtering function:

$$1+Rf.Y(s) \quad (3)$$

is created by software, which acts on the signal VL(s), as shown in FIG. 6, to produce a processed signal VP(s).

The signal VP(s) is now simply equal to the original applied signal VS(s) and the effects of the cable characteristic Y(s) will have been removed. Any reflections appearing after the completion of the applied test pulse VS(s) will now be visible without the unwanted cable input transient effect.

In the general case, the values of R, L, G and C, which make up the quantity Y(s), are unknown. However, it is possible to simplify matters as follows:

Equation (1) can be dealt with either in the time domain or in the frequency domain.

Time Domain Approach

By using the standard Laplace transform tables, the time domain solution Y(t) is:

$$Y(t)=Y_0[v(I_1(vt)+I_0(vt))e^{-ut}+\delta(t)] \quad (4)$$

This is the input admittance impulse response and represents a time function that can be convolved with an input signal, to produce the appropriate output signal.

For many practical applications the value of the cable parallel conductance G can be considered as 0, which results in v=−u, allowing equation (3) to be simplified to:

$$Y(t)=Y_0[v(I_1(vt)+I_0(vt))e^{vt}+\delta(t)] \quad (5)$$

which now has only two unknowns, $Y_0$ and v.

$Y_0$ is the reciprocal of the line characteristic impedance $Z_0$, which may well be known from cable data sheets. If not, $Z_0$ can be estimated as follows:

With reference to FIG. 4, the cable under test can be disconnected, to generate VS(t) as a pulse signal. As the TDR is now unloaded, the measured signal VL(t) will be equal to VS(t). Therefore the signal VS(t) can be measured.

Now, the cable under test can be connected (loaded condition) and the application of the pulse signal can be repeated. This time, the signal VL(t) gives the loaded response on the line.

It is well known that pulse edges contain the highest frequency components of a signal, so by examining the levels attained by the pulse edges in the unloaded condition=VS(t) and the loaded condition=VL(t) and by the use of Ohm's law, the high frequency value of the cable impedance=$Z_0$ can be found by computing:

$$(\text{level of pulse edge,loaded})=(\text{level of pulse edge,unloaded})\times Z_0/(Z_0+Rf) \quad (6)$$

$Z_0$ and hence $Y_0$ can thus be found.

Figure 7:
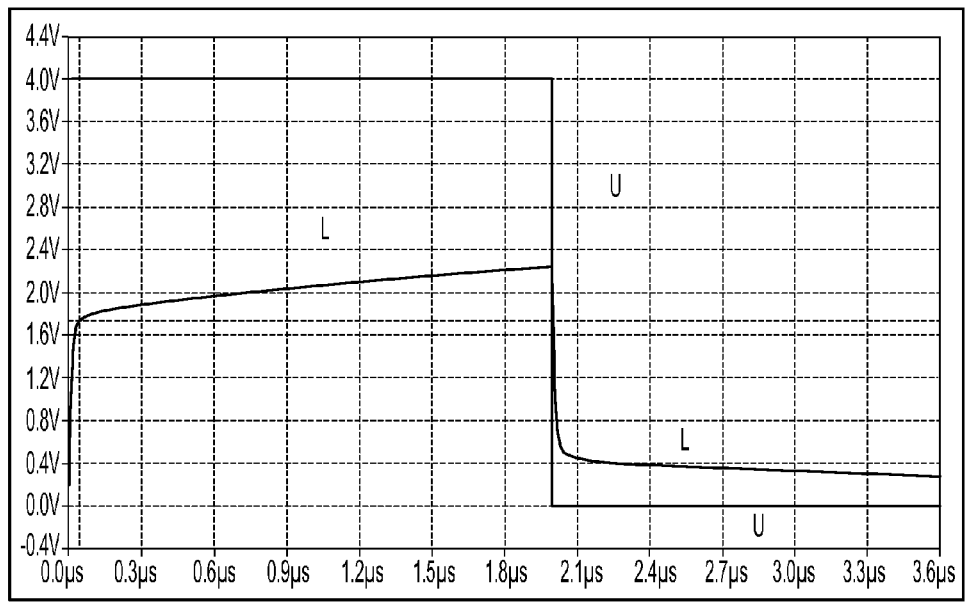
FIG. 7 is a graph showing unloaded and loaded TDR waveforms and pulse edge response, mapping voltage in volts against time in microseconds.

FIG. 7 shows an example of unloaded and loaded waveforms, U and L respectively. In this example:

Rf=125 ohms,
Level of pulse edge, unloaded=Vpu=4 volts, and
Level of pulse edge, loaded=Vpl=1.734 volts.

From equation (6), $Z_0=(Rf(Vpl/Vpu))/(1-(Vpl/Vpu))$, so
$Z_0=(125(1.734/4))/(1-(1.734/4))=125(0.4335/0.5665)$
=95.65 ohms and
$Y_0=1/95.65=0.01045$.

Figure 8:
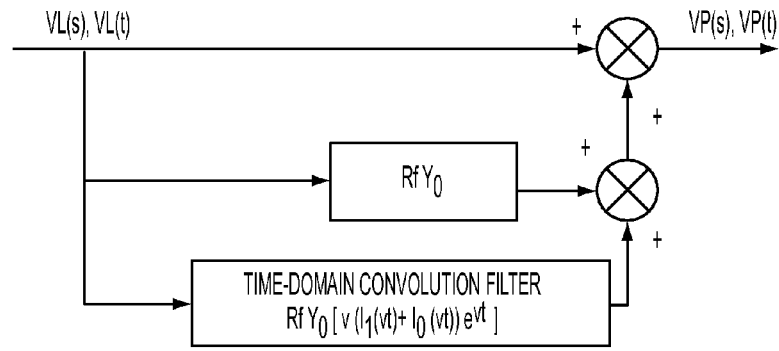
FIG. 8 is a partial diagrammatic representation of a filter circuit within a time domain reflectometer embodying the present invention, using time domain signal processing.

The filter of equation (3) can thus now be realised in block diagram form as shown in FIG. 8. The part of the filter represented by the equation $$Rf.Y_0[v(I_1(vt)+I_0(vt))e^{vt}] \quad (7)$$

can be realised in practice by taking the filter input in samples and applying it to a transversal FIR filter whose coefficients are set with the values of equation (7) as t varies from 0 to a suitably long settling time. The action of this well known arrangement implements the required convolution process.

Figure 9:
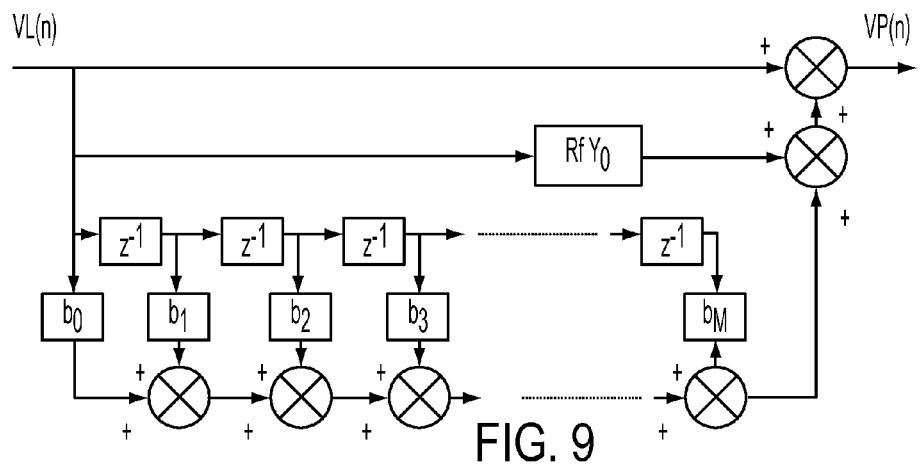
FIG. 9 is a signal processing diagram representing the filter circuit of FIG. 8, with the convolution filter realised by a transversal FIR filter arrangement.

The detail of a suitable realisation of the filter of equation (3) is shown in FIG. 9.

An auto-balance mechanism can now be described as:
1. Use data sheet value for $Y_0$ or estimate it using the method described above.
2. Start with some estimate value for v based on a reasonable value of R and L.
3. Apply the filter to a sample response containing an unwanted input transient.
4. Assess the flatness of the resulting TDR pulse by inspection of the trace after the first vertical transition and/or the trace after the second vertical transition.
5. Modify the value of v and repeat the process until the trace(s) after the transition reach optimum flatness.
6. If desired, modify the value of $Y_0$ around the original value and repeat steps 2 to 5 above to obtain an optimum response as a function of both v and $Y_0$.

Figure 10:
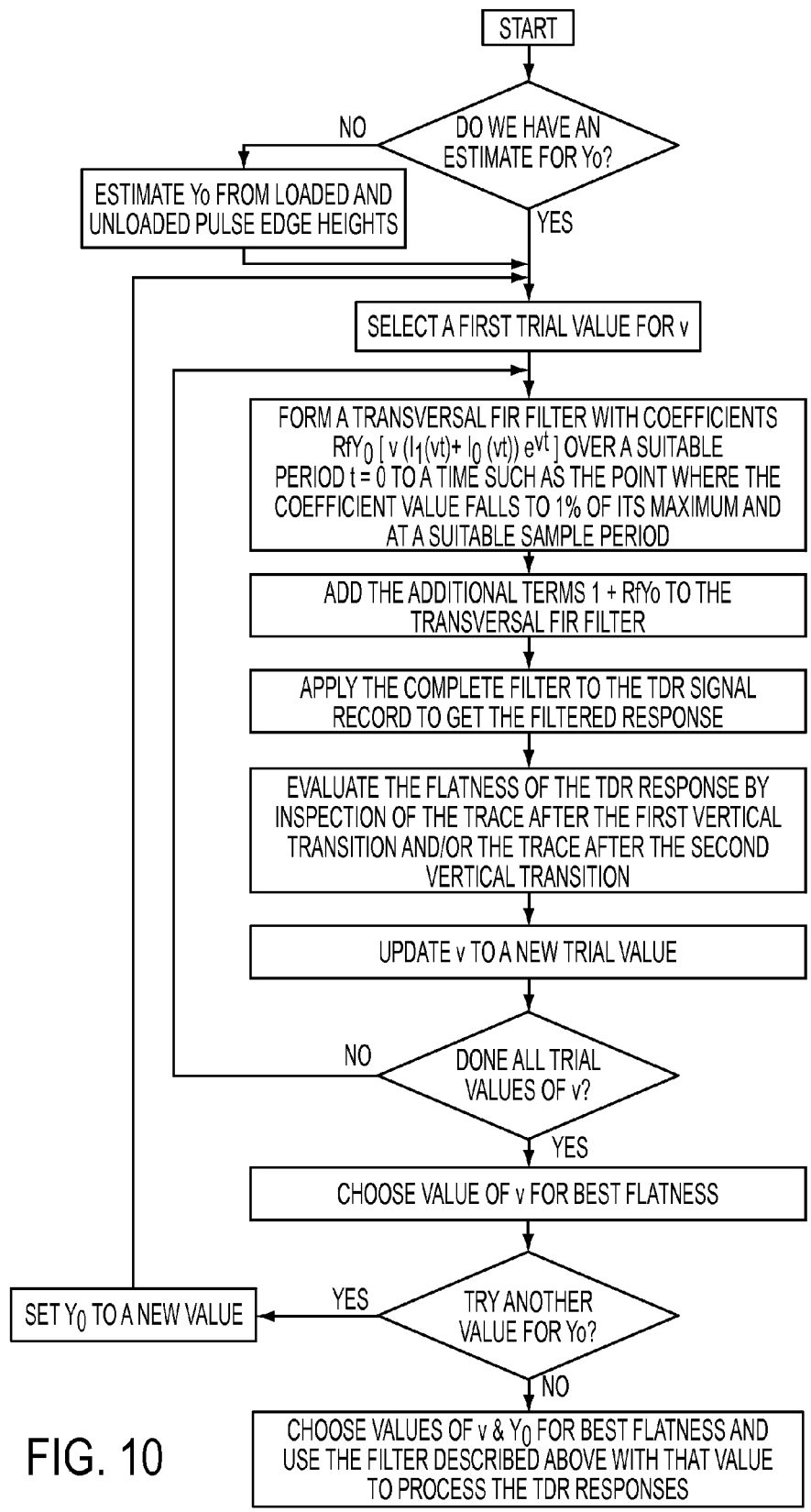
FIG. 10 is a flow diagram of a method of time domain reflectometry embodying the present invention, using time domain filtration.

FIG. 10 shows this process in flow chart form.

This is essentially the task of optimising a measure of goodness as a function of two variables.

In this case, it is desired to minimise the amount of transient response seen on the transmission line (cable) after the application of the first test pulse. In other words, the filtered transient response should decay to zero at the earliest opportunity and remain there, thus allowing subsequent fault reflections to be most easily detected.

A variety of measures exist to carry out this optimisation. These include:
(a) Take the integral of the magnitude of the deviation from zero, between a point shortly after the end of the applied test signal VS(t) and the earliest expected reflection signal.
(b) Take the integral of the square of the deviation from zero, between a point shortly after the end of the applied test signal VS(t) and the earliest expected reflection signal.
(c) Take time-weighted versions of either of (a) and (b) above to allow greater initial deviations in favour of smaller deviations at a later time.

It is anticipated that the "best" measure for a particular situation may be any of the above or indeed other measures that those skilled in the art will be familiar with.

Likewise, many methods exist to find the values of the variables (in this case v and $Y_0$) that result in the optimal condition. In the simplest case the condition to be optimised can simply be measured for all combinations of a set range of v values and a set range of $Y_0$ values, stored e.g. in a table. Once all measurements are done, that combination of values of v and $Y_0$ resulting in the best result can be used. Other standard methods exist to enable the optimum values of v and $Y_0$ to be located efficiently.

The optimisation is preferably implemented by a computer program. In the example of FIG. 10, the method iteratively modifies values of v and $Y_0$ and chooses the pair of values for best flatness. If $Y_0$ were known, the only v would be iteratively modified.

In real cables, the values of R, L, G and C and hence u and v may be frequency dependent. This variation is not represented in the time domain solution. In practice, however, the filter action provided by the arrangement described above quickly converges after a short period to substantially balance out the great majority of the unwanted cable input transient.

Figure 11:
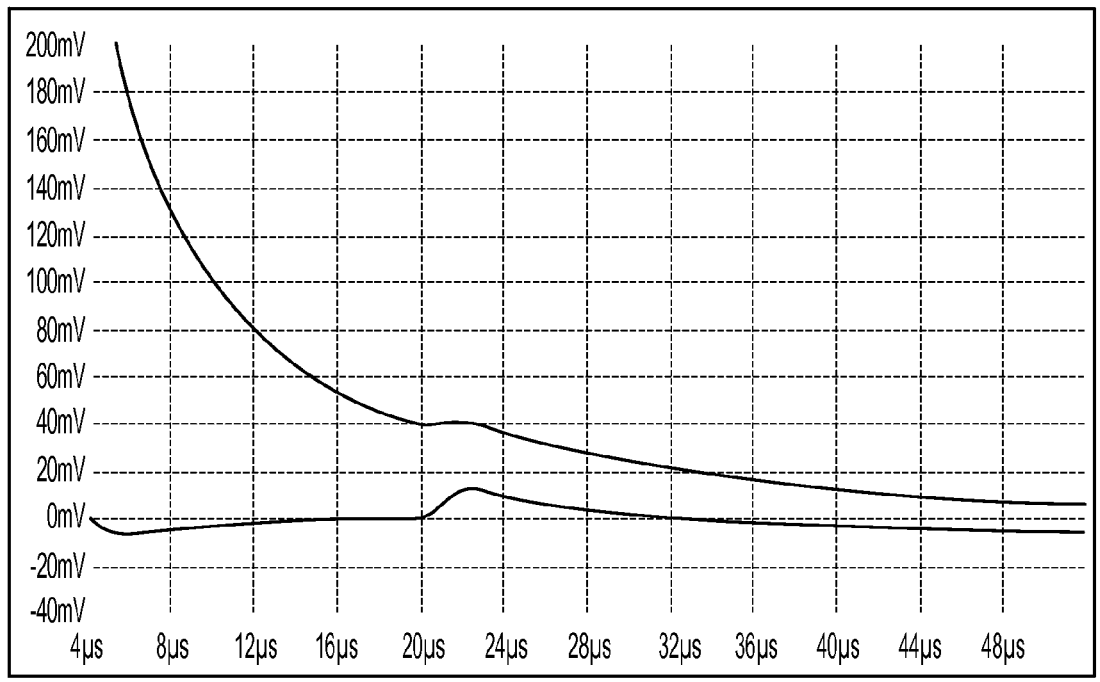
FIG. 11 is a graph showing a reflected signal from a cable under test both with and without the filtration embodying the present invention, in which voltage in millivolts is plotted against time in microseconds.

FIG. 11 shows the response of a sample cable with a high resistance fault. The upper curve is the unprocessed response comprising of both the unwanted cable input transient and the fault reflection signal at around 20 µs, the portion of the signal indicative of the fault. The lower curve shows the signal after processing by the arrangement described above. The substantial removal of the unwanted transient and the subsequent enhancement of the fault reflection signal is apparent.

Frequency Domain Approach

If suitable processing is available, the filtering may alternatively be done in the frequency domain. From Equation (1), the equation for the transmission line admittance in the frequency domain can be written:

$$Y(s)=Y_0\sqrt{((s+u+v)/(s+u-v))} \qquad (8)$$

If G=0 as is usual, then:

$$Y(s)=Y_0\sqrt{(s/(s+2u))} \qquad (9)$$

There are several options in forming a frequency domain filter, which can be applied to signals by means of the Fast Fourier Transform (FFT).

In this approach, the required convolution of the signal to be processed with the filter function is carried out in the frequency domain, by the well known technique of multiplying together the Fourier Transforms of the signal and the filter function and then taking the inverse Fourier transform to calculate the final result, for viewing in the time domain.

Figure 12:
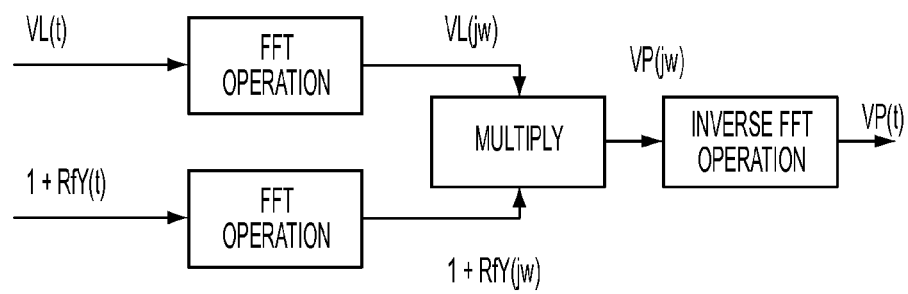
FIG. 12 is a schematic block diagram showing parts of a time domain reflectometer embodying the present invention, for filtration in the frequency domain.

FIG. 12 shows the general arrangement of the frequency domain approach for the filter.

Option a)

As with the time domain method, a first option is to approximate $Y_0$ as the inverse of the hf cable impedance and then tune u for maximum flatness. The actual components of the filter at each frequency can be calculated as: Real part $(1+Rf.Y_0\sqrt{(jw/(jw+2u))})$ and Imaginary part $(1+RfY_0\sqrt{(jw/(jw+2u))})$, where $j=\sqrt{(-1)}$ and w=the frequency of interest in radians per second.

Option b)

If the values of R, L, C and G are known, then the filter may be constructed using: Real part $(1+Rf\sqrt{((jwC+G)/(jwL+R))})$ and Imaginary part $(1+Rf\sqrt{((jwC+G)/(jwL+R))})$. In this case, if R, L, G and C are frequency dependant, this can be included to create a more accurate balance filter.

Option c)

If the characteristic Z(s) can be measured explicitly, e.g. by inspection of a cable test signal and the corresponding current, the Y(s)=1/Z(s) can be used to create a near perfect balance filter constructed using: Real part $(1+RfY(jw))$ and Imaginary part $(1+RfY(jw))$. Option a) is basically a technique in the frequency domain which provides a similar result to the time domain method. It is however more efficient, as the FFT method requires substantially less computation when compared to the time domain convolution filters.

Figure 13A:
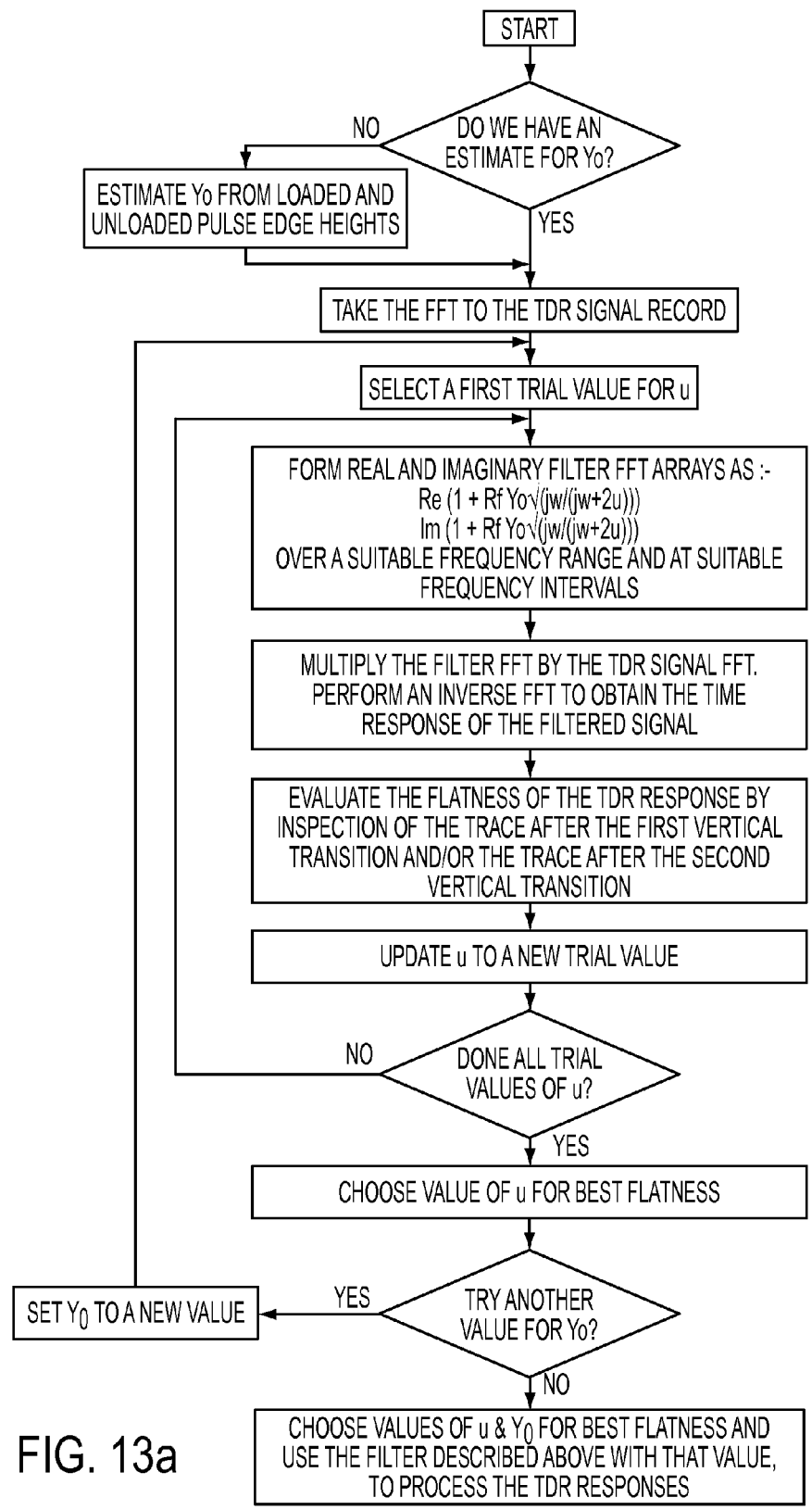
FIGS. 13a, 13b and 13c are alternative flow diagrams of time domain reflectometry methods embodying the present invention, for filtration in the frequency domain.

As shown in FIG. 13a, the process of Option a) is shown in flow chart form. It involves the steps:
1. Use a data sheet value for $Y_0$ or estimate it using the method described above.
2. Start with some estimate value for u based on a reasonable value of R and L.
3. Apply the filter to sample response containing an unwanted input transient.
4. Assess the flatness of the resulting TDR pulse by inspection of the trace after the first vertical transition and/or the trace after the second vertical transition.
5. Modify the value of u and repeat the process until the trace(s) after the transitions reach optimum flatness.

6. If desired, modify the value of $Y_0$ around the original value and repeat steps 2 to 5 above to obtain an optimum response as a function of both u and $Y_0$.

Figure 13B:
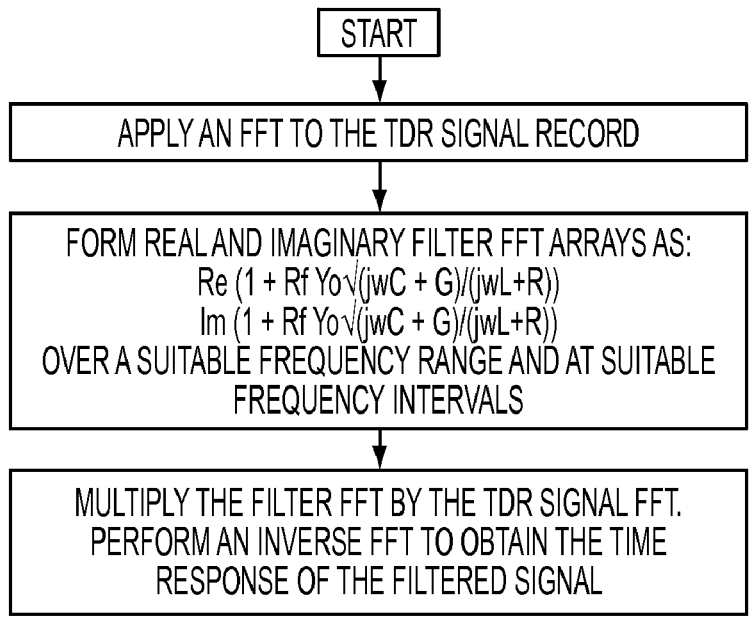

Option b) is shown in FIG. 13b and avoids searching for a best fit by using cable data if they are known.

Figure 13C:
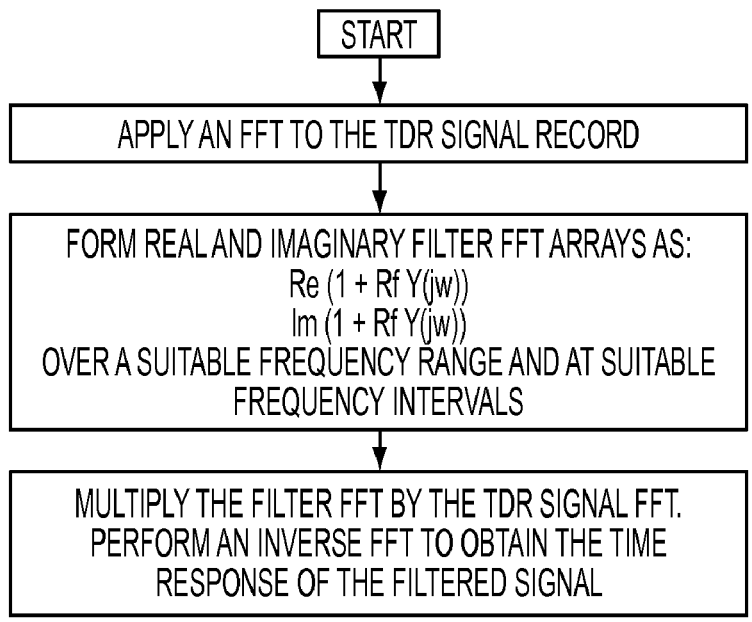

Option c) is shown in FIG. 13c and can provide the best balance filter if the cable input impedance characteristic can be obtained by measurement.

Figure 14A:
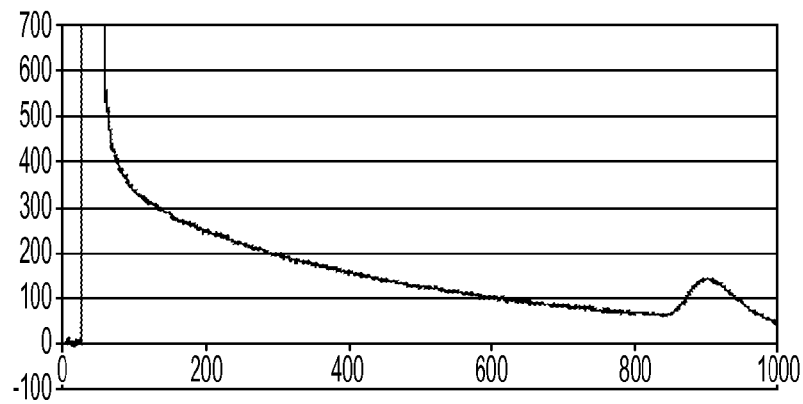
FIGS. 14a, 14b and 14c show reflected waveforms from a cable under test respectively without filtering; with frequency domain filtering using the flow diagram of FIG. 13a; and with frequency domain filtering using the flow diagram of FIG. 13c.

FIG. 14a shows the unprocessed response for a sample cable including the unwanted input transient signal.

Figure 14B:
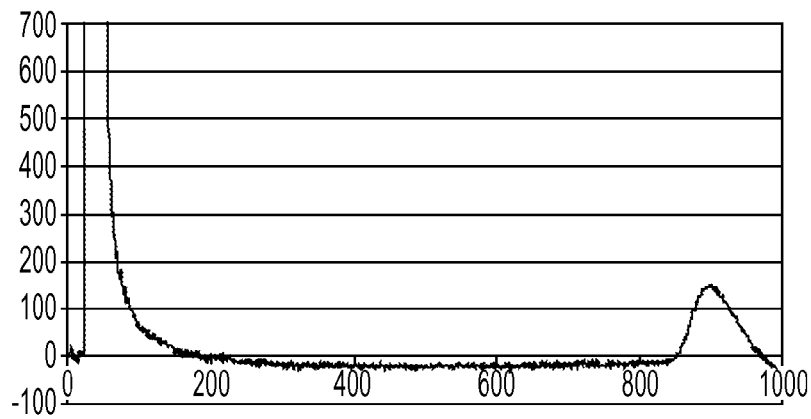

FIG. 14b shows the response after processing in the frequency domain by means of method option a) described above. As with the previously described time domain arrangement, the substantial removal of the unwanted transient and the subsequent enhancement of the fault reflection signal is again apparent.

Figure 14C:
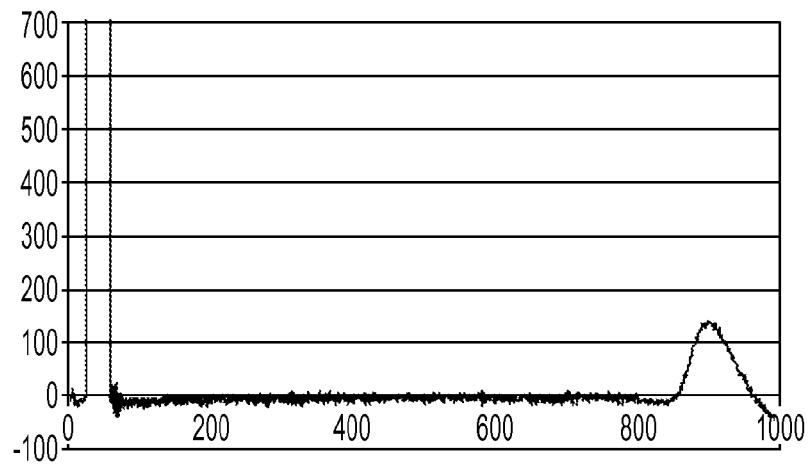

FIG. 14c shows the response after processing in the frequency domain by means of method option c) described above. In this case the removal of the input transient signal features further significant improvement.

The many features and advantages of the invention are apparent from the detailed specification, and, thus, it is intended by the appended claims to cover all such features and advantages of the invention which fall within the true spirit and scope of the invention. Further, since numerous modifications and variations will readily occur to those skilled in the art, it is not desired to limit the invention to the exact construction and operation illustrated and described, and, accordingly, all suitable modifications and equivalents may be resorted to that fall within the scope of the invention.

What is claimed is:

1. A time domain reflectometer for testing an electrical cable, comprising:
   a test signal generator;
   at least one line feed resistor, connected between the test signal generator and a pair of terminals, for connection to the ends of an electrical cable under test; and
   a signal processor, connected to the terminals, to receive a line signal including a reflection of a test signal transmitted into the cable under test,
   wherein the signal processor is programmed to filter the line signal to enhance a portion of the signal indicative of any fault on the cable by balancing the signal according to the electrical characteristics of a normal cable of the same type as the cable under test, by applying a filter function: $1+Rf.Y(s)$ to the reflected signal, where Rf is the resistance of the feed resistor, and $Y(s)$ is an estimate of the input admittance of the transmission line, s being the Laplace variable, and acquiring at least one estimate of $Y(s)$ from known or estimated electrical characteristics of the cable under test selected from the variables:
   C, the distributed line capacitance per unit length
   L, the distributed line inductance per unit length
   R, the distributed line resistance per unit length and
   G, the distributed line conductance per unit length
   or functions of these variables,
in the equation for input admittance in the Laplace domain:

$$Y(s)=\sqrt{((sC+G)/(sL+R))}.$$

2. A time domain reflectometer according to claim 1, further comprising a user interface for entering estimates of the electrical characteristics of the cable and the test.

3. A time domain reflectometer according to claim 1, further comprising a display for the filtered signal.

4. A time domain reflectometer according to claim 1, wherein the signal processor is programmed to filter the line signal dynamically by iteratively modifying values of one or two estimates of the electrical characteristics and selecting from this value or from these values to optimise the enhancement of the said portion of the signal.

5. A time domain reflectometer according to claim 4, wherein the test signal comprises a pulse and the signal processor is programmed to select from the said values of the estimate or estimates the value or values that optimise the flatness of the portion of the line signal for the period ending with the first appearance of a reflection of the pulse.

6. A time domain reflectometer according to claim 4, wherein two estimated electrical characteristics are $Y_0$ and v, where: $Y_0=(L/C)^{-1/2}$ and $v=\frac{1}{2}((G/C)-R/L))$.

7. A time domain reflectometer according to claim 6, wherein the signal processor is programmed to receive an estimate of $Y_0$ and to iteratively modify values of v to generate a best estimate that optimises the said enhancement.

8. A time domain reflectometer according to claim 6, wherein the signal processor is programmed to iteratively modify estimates of both $Y_0$ and v to generate best estimates that optimise the said enhancement.

9. A time domain reflectometer according to claim 4, wherein two estimated electrical characteristics are $Y_0$ and u, where $Y_0=(L/C)^{-1/2}$ and $u=\frac{1}{2}((G/C)+(R/L))$.

10. A time domain reflectometer according to claim 9, wherein the data processor is programmed to receive an estimate of $Y_0$ and to iteratively modify values of u to generate a best estimate that optimises the said enhancement.

11. A time domain reflectometer according to claim 1, further comprising means for measuring $Z(s)=1/Y(s)$ of the cable under test, wherein the signal processor is programmed to use that value for the estimate of $Y(s)$.

12. A time domain reflectometer for testing an electrical cable, comprising:
   test signal generator means;
   at least one line feed resistor means, connected between the test signal generator means and a pair of terminals, for connection to the ends of an electrical cable under test; and
   a means for processing signals, connected to the terminals, to receive a line signal including a reflection of a test signal transmitted into the cable under test,
   wherein the means for processing signals is programmed to filter the line signal to enhance a portion of the signal indicative of any fault on the cable by balancing the signal according to the electrical characteristics of a normal cable of the same type as the cable under test, by applying a filter function: $1+Rf.Y(s)$ to the reflected signal, where Rf is the resistance of the feed resistor, and $Y(s)$ is an estimate of the input admittance of the transmission line, s being the Laplace variable, and acquiring at least one estimate of $Y(s)$ from known or estimated electrical characteristics of the cable under test selected from the variables:
   C, the distributed line capacitance per unit length
   L, the distributed line inductance per unit length
   R, the distributed line resistance per unit length and
   G, the distributed line conductance per unit length
   or functions of these variables,
in the equation for input admittance in the Laplace domain:

$$Y(s)=\sqrt{((sC+G)/(sL+R))}.$$

* * * * *